United States Patent [19]

Bright et al.

[11] 4,354,718

[45] Oct. 19, 1982

[54] DUAL-IN-LINE PACKAGE CARRIER AND SOCKET ASSEMBLY

[75] Inventors: Edward J. Bright, Elizabethtown; Steven J. Kandybowski, Tower City, both of Pa.

[73] Assignee: AMP Incorporated, Harrisburg, Pa.

[21] Appl. No.: 179,371

[22] Filed: Aug. 18, 1980

[51] Int. Cl.³ .......................................... H01R 13/24
[52] U.S. Cl. ......................... 339/17 CF; 339/176 MP
[58] Field of Search ........ 339/17 CF, 75 MP, 176 M, 339/176 MP

[56] References Cited

U.S. PATENT DOCUMENTS

| | | | |
|---|---|---|---|
| 3,345,541 | 10/1967 | Cobaugh et al. | 339/17 CF |
| 3,409,861 | 11/1968 | Barnes et al. | 339/17 CF |
| 3,480,902 | 11/1969 | Barnes et al. | 339/17 CF |
| 3,529,277 | 9/1970 | Barnes | 339/17 CF |
| 3,784,960 | 1/1974 | Bruckner | 339/17 CF |
| 3,796,921 | 3/1974 | Fischer | 339/17 CF |
| 3,825,876 | 7/1974 | Damon | 339/17 CF |

FOREIGN PATENT DOCUMENTS 1152765 5/1969 United Kingdom ........... 339/17 CF

OTHER PUBLICATIONS

IBM Bulletin, Morgan et al., Joining Dip Modules 12-1968, vol. 11, No. 7, pp. 736 and 737.

Primary Examiner—Joseph H. McGlynn
Attorney, Agent, or Firm—Allan B. Osborne

[57] ABSTRACT

The present invention discloses a protective carrier for a dual-in-line package (DIP) and a socket which receives the loaded carrier to electrically connect the leads on the DIP to circuits on a printed circuit board (PCB). More particularly, the protective carrier comprises a frame into which the DIP is secured. The socket consists of a housing with a row of contact terminals on each side. The carrier slides down over the housing whereby leads on the DIP within the carrier make contact with the terminals.

9 Claims, 5 Drawing Figures

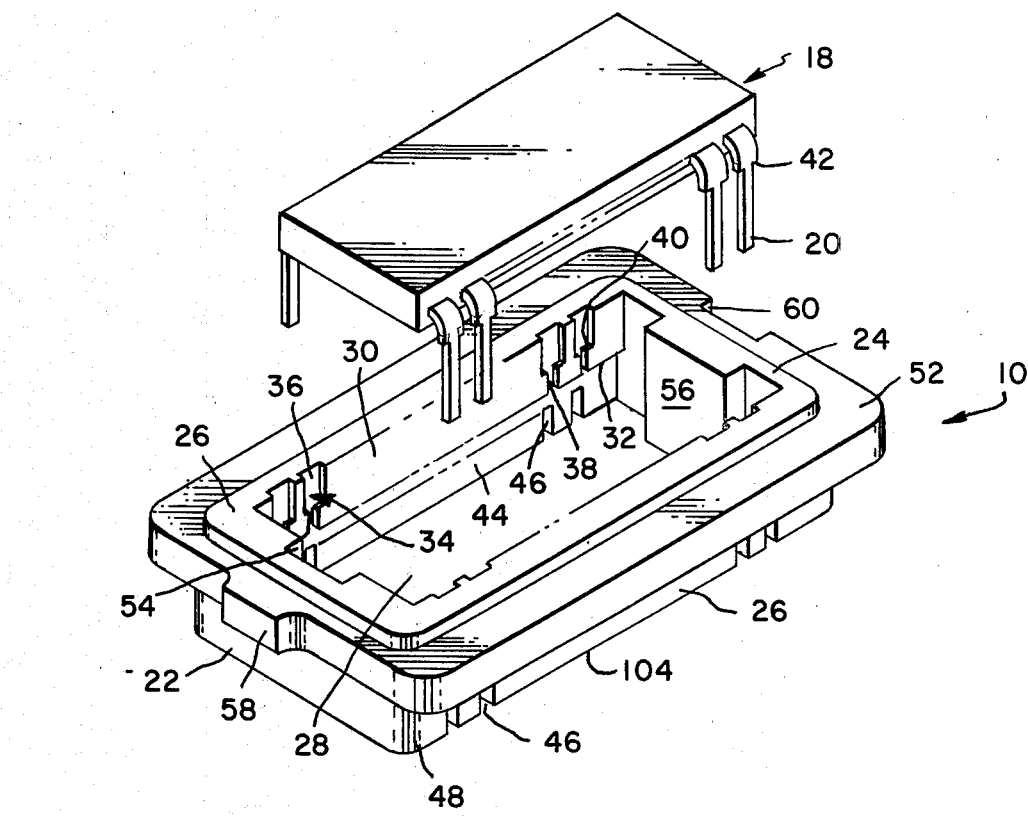
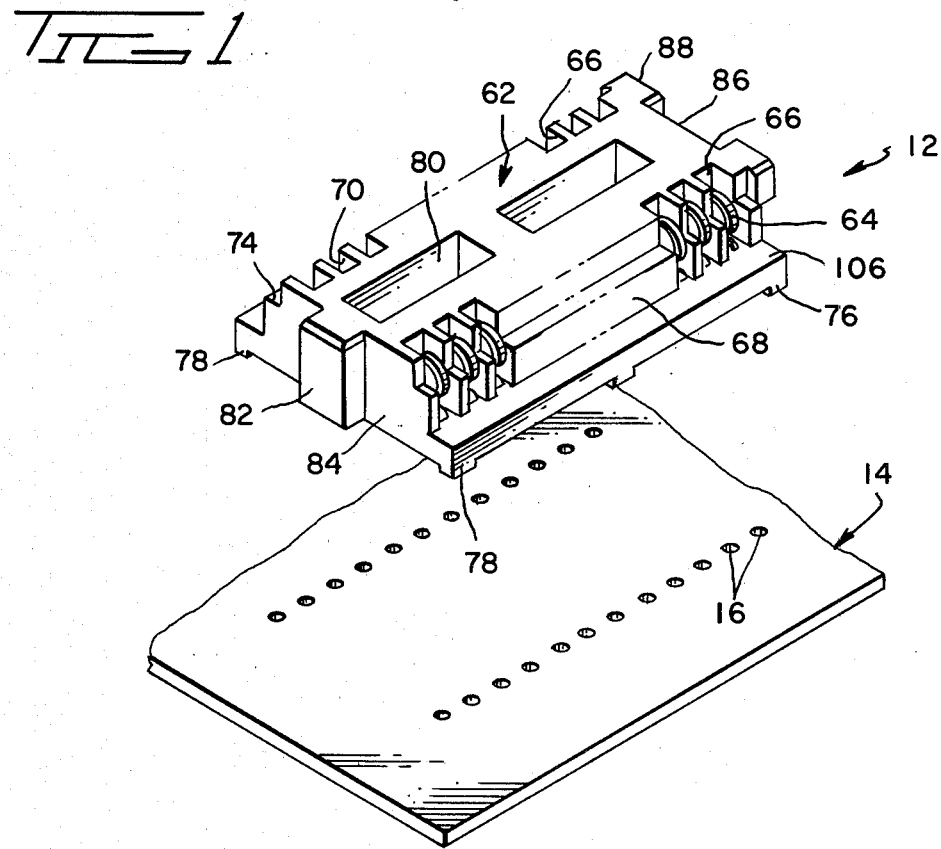
FIG 1

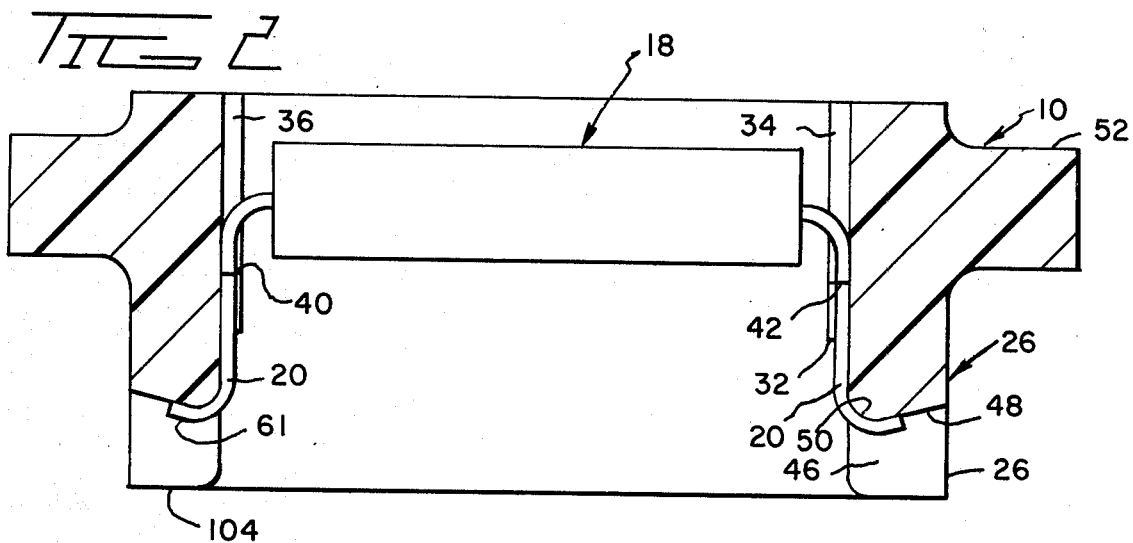
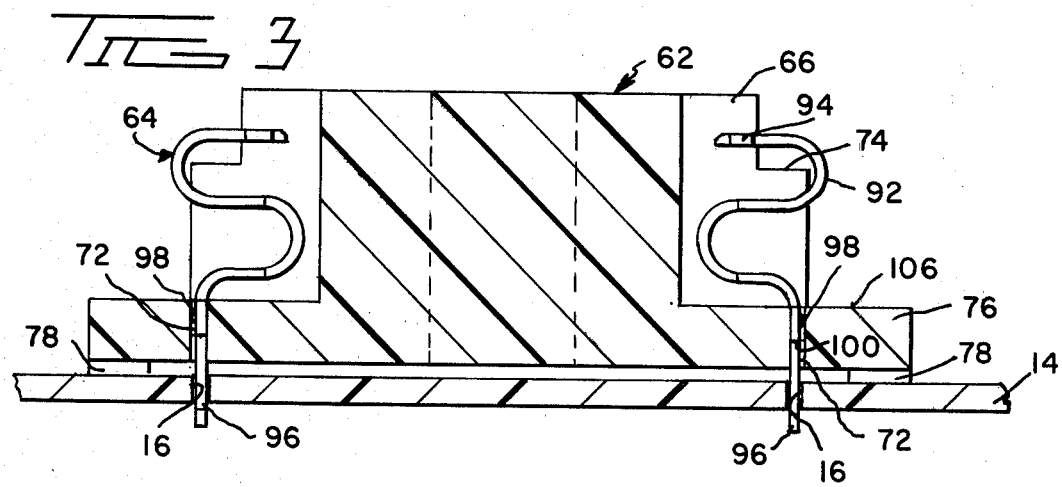
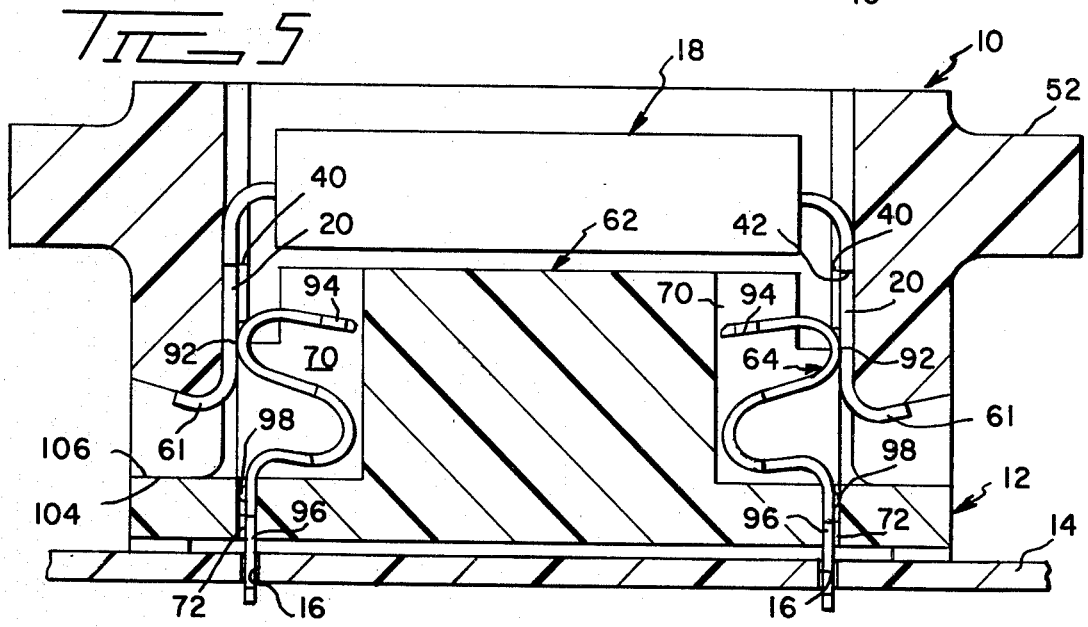

DUAL-IN-LINE PACKAGE CARRIER AND SOCKET ASSEMBLY

BACKGROUND OF THE INVENTION

1. The Field of the Invention

This invention relates to a carrier for handling and protecting DIP's and a socket onto which the carrier can be placed whereby the leads on the enclosed DIP become electrically terminated.

2. The Prior Art

Prior art carriers for integrated circuit devices are disclosed in U.S. Pat. Nos. 3,345,541 and 3,409,861. In both disclosures, support blocks are provided which hold the integrated circuit device during handling and usage, i.e., the circuit device and the block, as a unit, are plugged into a suitable connector or socket to terminate the circuit device's leads. The connector or socket may be connected to a PCB, a test fixture, or the like.

SUMMARY OF THE INVENTION

A protective carrier of insulating material has a central opening therethrough into which a DIP is positioned. Grooves on the inside surfaces of the side walls defining the opening receive the leads on the DIP. The leads extend down the side walls and are bent around the bases thereof to lock the Dip in the carrier. The socket includes an insulative housing having a plurality of laterally open cells on two opposing sides and terminals which are positioned in the cells. Legs on the terminals extend below the socket for insertion into a PCB. The terminals have contact surfaces which engage the leads on the DIP when the carrier is placed onto the socket.

BRIEF DESCRIPTION OF THE DRAWINGS

FIG. 1 is a perspective view of the protective carrier and socket of the present invention. Also shown is a PCB and a DIP;

FIG. 2 is a cross-sectional view of the protective cover with the DIP positioned therein;

FIG. 3 is a cross-sectional view of the socket;

FIG. 5 is a cross-sectional view showing the assembly of FIG. 2 mounted on the socket of FIG. 3.

DESCRIPTION OF THE INVENTION

Figure 4:
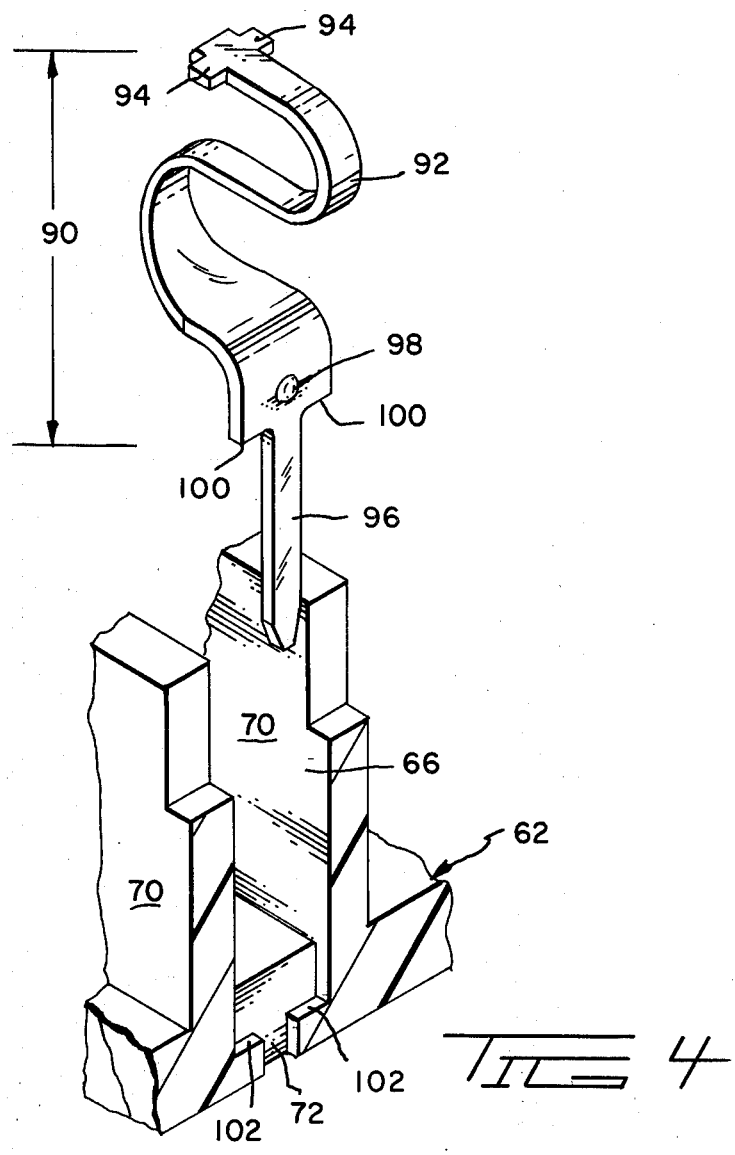
FIG. 4 is an enlarged view of a terminal and a cell of the socket.

With reference to FIG. 1, the protective carrier and socket of the present invention are indicated generally by reference numerals 10 and 12, respectively. PCB 14 having plated-through holes 16 is shown below the socket. DIP 18 and its leads 20 is shown above protective carrier 10.

Protective carrier 10 is preferably molded from RY-NITE 530 which is a tradename for an insulating material produced and sold by the DuPont Company.

Carrier 10 has a first and second end walls 22 and 24, respectively, and side walls 26. The four walls define a central, DIP-receiving opening 28. As shown, the opening extends vertically through the carrier.

The inside surfaces of side walls 26 are stepped with the upper section, generally indicated by reference numeral 30, extending further into the central opening than the lower section. Downwardly facing shoulder 32 is defined by the stepped surface. A plurality of spaced, lead-receiving grooves 34 are located along the length of the two opposing upper sections. These grooves have a wide upper portion 36 and a narrow lower portion 38. The juncture therebetween defines an upwardly facing shoulder 40 on each side of the entrance to the lower portion. The floor of each groove is coplanar with the surface of lower section 44 of the side walls. The groove structure mirrors that of the portion of lead 20 coming out of the DIP and the downwardly facing shoulders 42 thereon.

A plurality of downwardly open slots 46 cut through the lower portion of the side walls. Each slot is in alignment with a groove 34. As shown in FIG. 2, downwardly facing floor 48 of each slot is curved adjacent the inside surface of the side wall as indicated by reference numeral 50. Preferably the floor slopes up from the curved portion outwardly.

As shown in FIG. 1, handling, polarizing and indicator means are provided on the protective carrier. A laterally projecting ledge 52 located on the outside surfaces of the carrier provides a means for grasping and handling it.

Polarizing means include vertical slot 54 in the inside surface of end wall 22 and a vertical bar 56 on the inside surface of end wall 24. These structures cooperate with complementary structures on socket 12 so that the carrier can be placed on the socket in only one orientation.

Indicator means include boss 58 on ledge 52 adjacent end wall 22 and slot 60 in the ledge adjacent end wall 24. These indicators provide both visual and tactile means for orientating the carrier prior to placing it onto socket 12.

FIG. 2 shows a DIP 18 positioned in protective carrier 10. The assembly of the two begins with the DIP as shown in FIG. 1; i.e., leads 20 are straight. The DIP is placed into the carrier with the leads being received in grooves 34 and is pushed down until the downwardly facing shoulders 42 on the lead abut upwardly facing shoulders 40 in the grooves. A tool (not shown) is then driven up from below and the free ends 61 of leads 20 are bent around into slots 46 and up against floors 48. Curved entry 50 facilitates the lead bending. DIP 18 is now locked into carrier 10; i.e., the bent-up leads prevent withdrawal and shoulders 40 in the grooves prevent downward travel.

Socket 12 consists of a housing 62 and terminals 64. The housing, preferably molded from the same insulating material as carrier 10, has a plurality of terminal-receiving cells 66 along each longitudinal side 68. Each cell is defined by vertical walls 70 and is open upwardly and laterally. As shown clearly in FIG. 5, a hole 72 extends from each cell down through the base and opens out on the under side of the housing. Details of hole 72 are shown in FIG. 4 and are described below.

Sides 68 are stepped to provide an upwardly facing shoulder 74. The base 76 of the housing extends outwardly of sides 68. A series of feet or stand-offs 78 are provided on the under side of the housing. A pair of vertical shafts 80 are provided in the housing to reduce the amount of material required to mold the housing.

Complementary polarizing means on housing 62 include a projecting boss 82 on end 84 and a vertical slot 86 on opposite end 88. As carrier 10 is placed onto the socket, boss 82 slides in vertical slot 54 and slot 86 receives bar 56. Obviously these complementary polarizing keys prevent a mismating.

A terminal 64 is shown in enlarged detail in FIG. 4 along with a section of socket housing 62.

Terminal 64 is preferably stamped and formed from a coplanar strip of conductive material such as phosphor bronze. The terminal has an S-shaped upper section 90. The upper concave-convex curve 92 provides a contact surface. The top of the terminal has a pair of laterally projecting ears 94 which centers the terminal in cell 66. The S-shape gives the terminal a high degree of resiliency. Pin 96 depends from upper section 90 and is adapted for insertion into plated-through hole 16 on PCB 14. Dimple 98, located immediately above the pin, provides a retention force to keep the terminal in housing 62.

The width of the terminal increases from the top to the juncture with pin 96. The wider width adjacent the juncture improves the stability of the terminal in the housing without sacrificing the aforementioned resiliency of the upper section. The juncture defines two downwardly facing shoulders 100 which rest on two upwardly facing shoulders 102 in hole 72.

FIG. 3 is a cross-sectional view of socket 12 mounted on PCB 14. The view shows the positioning of terminals 64 in cells 66. The space between the socket and PCB is provided by stand-offs 78.

FIG. 5 shows the carrier and the contained DIP 18 placed onto socket 12. As carrier 12 is pushed down over the socket, leads 20 and terminals 64 contact each other for an electrical connection. The terminals are moved inwardly during the downward movement of the carrier and in doing so, wiping between each lead and the mating contact area 92 occurs. The wider lower portion of the terminals accommodate the inward flexing without the material taking a set.

The protective carrier moves down until the base 104 of side walls 26 rests on the upper surface 106 of socket housing base 76.

The present invention provides a way in which a DIP may be protected from the time of manufacture until it is discarded. It provides an extremely fool-proof replacement method such that a mechanic for example, can replace a DIP from a PCB mounted socket in an automobile without fear of damaging the DIP and its leads.

The present invention may be subject to many modifications and changes without departing from the spirit or essential characteristics thereof. The present invention is therefore to be considered in all respects as illustrative and not restrictive of the scope of the invention.

What is claimed is:

1. A protective carrier for a DIP of the type having depending leads emerging from opposing sides with each lead having laterally positioned, downwardly facing shoulders, said protective carrier comprising a frame consisting of spaced apart, opposing side walls joined by end walls, said side and end walls defining a DIP-receiving central opening therebetween, the inside surfaces of the opposing side walls being stepped with the upper section extending further into the central opening relative to the lower section, a plurality of lead-receiving grooves spaced along the upper sections of the side walls with the grooves having an upper wide portion and a lower narrow portion with the juncture therebetween defining an upwardly facing shoulder on each side of the entrance to the narrow portion, and a plurality of downwardly opened slots provided through the lower section of the side walls, said slots being in alignment with the lead-receiving grooves so that upon inserting a DIP into the central opening, the leads are received in the grooves with the upwardly facing shoulders abutting the downwardly facing shoulders on the leads to support the DIP in the central opening and the free ends of the leads may be bent into the slots to restrain withdrawal of the DIP from the central opening.

2. The protective carrier of claim 1 wherein the floor of the slots adjacent the inside surfaces of the side walls are curved.

3. The protective carrier of claim 2 further including an encompassing ledge attached to and projecting outwardly from the frame, said ledge providing means for grasping and handling the protective carrier.

4. The protective carrier of claims 1, 2 or 3 further including a socket for receiving the protective carrier and for electrically connecting a DIP which may be positioned therein, said socket comprising:
   a. a housing of insulating material which is received into the central opening below a DIP which may be positioned therein, the housing having a plurality of terminal-receiving cells in and spaced along two opposing sides with the cells being open laterally, and holes extending from each cell to the under side of the housing; and
   b. a plurality of terminals stamped and formed from conductive material positioned in the cells with pins thereon extending through the holes and below the housing for insertion into a PCB for electrical contact with circuits thereon, said terminals further having an S-shaped upper section with the free top end being generally horizontal relative to the longitudinal axis and with a convex surface extending laterally from the cell for electrical contact with a lead extending down from a DIP which may be in a protective carrier positioned on the housing.

5. The protective carrier of claim 4 further including complementary polarizing means on the protective carrier and socket.

6. The protective carrier of claim 5 further including indicating means on the encompassing ledge.

7. A socket for use with a protective carrier of the type receiving and retaining a DIP within a central opening wherein the leads from the DIP extend down along the inside surfaces of the side walls of the carrier, said socket comprising:
   a. a housing and integral base of insulating material, said housing being received within the central opening when the protective carrier is placed thereover, said housing having a plurality of terminal receiving cells in and spaced along two opposing sides with vertical walls defining and isolating adjacent cells which are open laterally, holes extending from the cells downwardly through the base and opening out on the under side thereof and said base extending laterally beyond the sides of the housing; and
   b. a plurality of terminals stamped and formed from a coplanar strip of conductive material and having an S-shaped, resilient upper section with a narrow width pin extending downwardly therefrom, the free end of the upper section being horizontal relative to the longitudinal axis of the terminal and having an ear projecting laterally on each side, further the upper section increasing in width from the free end to the juncture with the pin, said terminals being positioned in the cells with the pins extending through the holes and below the under side of the base for insertion into a PCB, and with a convex surface on the upper section projecting laterally out of the cell for electrical contact with a lead extending down from a DIP which may be in a protective carrier placed onto the housing.

8. In combination a protective carrier for a DIP having depending leads emerging from opposing sides with each lead having downwardly facing shoulders and a socket for receiving the protective carrier and for electrically connecting a DIP which may be positioned therein, said combination comprising:

a. a carrier comprising a frame of insulating material having a DIP-receiving central opening therethrough and means for removably securing the DIP therein, said means including upwardly facing shoulders on the inside surfaces of opposing side walls of the frame which abut the downwardly facing shoulders on the leads thereby supporting and preventing travel in one direction by the DIP and further including slots spaced along the base of the opposing side walls into which the leads may be bent to prevent travel by the DIP in an opposing direction;

b. a socket comprising a housing of insulative material which extends into the central opening when the protective carrier is placed thereover, said housing having a plurality of terminal receiving cells spaced along opposing, outwardly facing side walls of the housing; and c. a plurality of terminals positioned in the cells with pins thereon extending downwardly through the housing for insertion into a PCB, and upper sections with a convex surface extending outwardly from the cells for electrical engagement with the leads on the DIP.

9. The protective carrier of claim 8 further including complementary polarizing means on the protective carrier and the socket so that the protective carrier may be placed on the socket in a predetermined orientation.

* * * * *